United States Patent [19]

Chen et al.

[11] Patent Number: 4,958,243

[45] Date of Patent: Sep. 18, 1990

[54] PHASE DISCRIMINATION AND DATA SEPARATION METHOD AND APPARATUS

[75] Inventors: Shin C. Chen, San Jose; Lionel D. Provazek, Campbell, both of Calif.

[73] Assignee: International Business Machines Corporation, Armonk, N.Y.

[21] Appl. No.: 245,100

[22] Filed: Sep. 15, 1988

[51] Int. Cl.$^5$ ............................................. G11B 5/09
[52] U.S. Cl. ....................................... 360/51; 360/48
[58] Field of Search ...................... 360/51, 48; 375/82, 375/95, 118–120; 331/1 A; 328/155

[56] References Cited

U.S. PATENT DOCUMENTS

| | | | |
|---|---|---|---|
| 3,614,635 | 10/1971 | LaPine et al. | 328/155 |
| 3,701,039 | 10/1972 | Lang et al. | 331/1 A |
| 4,034,309 | 7/1977 | Vaughn | 331/1 A |
| 4,682,121 | 7/1987 | Chapman | 331/1 A |
| 4,809,088 | 2/1989 | Lofgren | 360/51 |
| 4,829,545 | 5/1989 | Guzik | 360/51 |
| 4,837,643 | 6/1989 | Tierney, III | 360/51 |

*Primary Examiner*—Vincent P. Canney
*Attorney, Agent, or Firm*—Henry E. Otto, Jr.

[57] ABSTRACT

Phase discrimination and data separation method and apparatus for on-track error recovery by shifting input data in time relative to a clock to improve recovery of error bits due to bit shift in a disk storage system having a servo clock syncronized to a disk's rotational speed and a refernce clock which must be synchronized to the servo clock to insure that the data previously written onto the disk will be retrieved correctly during read back. Data encoded in (1,7) or denser codes can be recovered because of fewer transitions in a phase discriminator and therefore a shortened phase discrimination cycle in a feedback loop to avoid interference into the following correction. Readback data pulses for address mark (AM) search operations are standardized while a PLL is phase locked to the servo data, reducing or eliminating misdetection of AM due to delay skew or pulse width variations. Sequential logic avoids race conditions.

11 Claims, 7 Drawing Sheets

PHASE DISCRIMINATION AND DATA SEPARATION METHOD AND APPARATUS

FIELD OF THE INVENTION

This invention relates to a method and apparatus for recovering data recorded on a magnetic storage medium, and more particularly to a phase discrimination and data separation method and apparatus for use in a data processing system wherein a reference clock signal must be synchronized to either a clock signal provided by a servo system or to a servo synchronized read back signal.

BACKGROUND OF THE INVENTION

In binary magnetic storage media, data are recorded in the form of reversals of magnetic flux transitions. The information content is in time separating any two flux reversals. A clocking reference is provided by a data separator to measure this time interval and hence to retrieve the data previously recorded. Due to speed variations of the media drive mechanism in a magnetic storage system, the data separator must operate in a closed loop feedback system, and the clock it provides must be capable of varying its frequency to track variations in speed of the recording medium. The clock is normally produced by a voltage controlled oscillator (VCO) whose frequency is controlled by a phase discriminator. The phase discriminator measures phase difference between the clock and the incoming data and causes the frequency of the VCO to vary accordingly. In this way a desired phase relationship between the two signals can be established to recover data pulses that are received. U.S. Pats. Nos. 3,614,635, 3,701,039, 4,034,309 and 4,682,121 disclose typical prior art systems of this general type.

These and other previously implemented phase discriminator and data separator systems known to applicants require excessive time to complete measurement of the phase difference between the clock and data denser than (2,7) run length limited (RLL) coded data. This causes bits to be dropped, race problems and incorrect synchronization when (1,7) or equivalent codes are employed.

The exact placement of a magnetic transition in time relative to its adjacent transitions can be altered by magnetic imperfection in the recording medium, interference from adjacent transitions, or noise and imperfection in the detection processes, as well as the variations in the media drive mechanism previously mentioned. All these influence readback errors. One way to recover errors encountered during readback is to offset the head with respect to the data track. When changing head offset, both the clock and the data are modified slightly to affect only those datum pulses that have just missed their respective detection windows. The head offset change may not always be in the direction to recover the errors. Moreover, changing head offset involves a mechanical movement of the head, which will degrade the performance.

Furthermore, in prior art systems known to applicants, the widths of the detected read datum pulse for address mark (AM) search operations were not standardized and resulted in data pulse widths being too wide or too narrow and therefore unrecognizable by the system. Whenever an AM search operation was called for, the data separators did not provide any re-synchronization and/or re-shaping of the readback data pulses. This could result in a missing AM due to improper recovery of the AM data bits.

There is a need for a phase discriminator and data separator system that includes a data shifting function (shifting earlier and/or later) for recovering error bits that have just missed their respective detection (time) windows and have been identified as potentially uncorrectable errors. In addition, it is desirable that in AM search operations, the readback pulses be standardized to one clock period (preferably derived from servo data) to eliminate the effects due to pulsewidth variations and delay skew between the output data and the clock.

SUMMARY OF THE INVENTION

Toward this end, the phase discrimination and data separation method and system according to the invention provide means for on-track error recovery by shifting input data in time relative to the clock to improve recovery of error bits due to bit shift. The invention is useful in a disk storage system comprising a servo clock which is synchronized to a disk's rotational speed and a reference clock which must be synchronized to the servo clock to insure that the data previously written onto the disk will be retrieved correctly during read back. Data encoded in (1,7) or equivalent codes can be recovered by having fewer transitions in the phase discriminator and therefore a shortened phase discrimination cycle in the feedback loop to avoid interference into the following correction. Readback data pulses for AM search operations is standardized while the Phase Locked Loop (PLL) is phase locked to the servo data, thereby to reduce or eliminate misdetection of AM due to delay skew or pulse width variations. Finally, the system employs sequential logic to avoid a race condition.

Read data pulses are standardized to a data-synchronized clock by shifting the read data pulses in one direction in time relative to the clock when a control signal indicates a potentially uncorrectable error. The shifted read data pulses are then compared relative to the clock and a data-standardized-to-clock (DSTC) signal is generated and transmitted to error-correction circuitry. If the error is not corrected by the error correction circuitry, the read data pulses are shifted in the other direction in time; whereupon the error-correction circuitry will again attempt to correct the error. Read data pulses may be shifted earlier in time relative to the clock because all successive read data pulses are delayed to a clock-establishing PLL for a preselected time interval. Read data pulses can also be standardized to a servo-data-synchronized clock during an address mark search operation by applying the servo data pulses to the PLL for synchronizing the clock, and thereafter applying the read data pulses to the DSTC circuitry.

DESCRIPTION OF PREFERRED EMBODIMENTS

Figure 1:
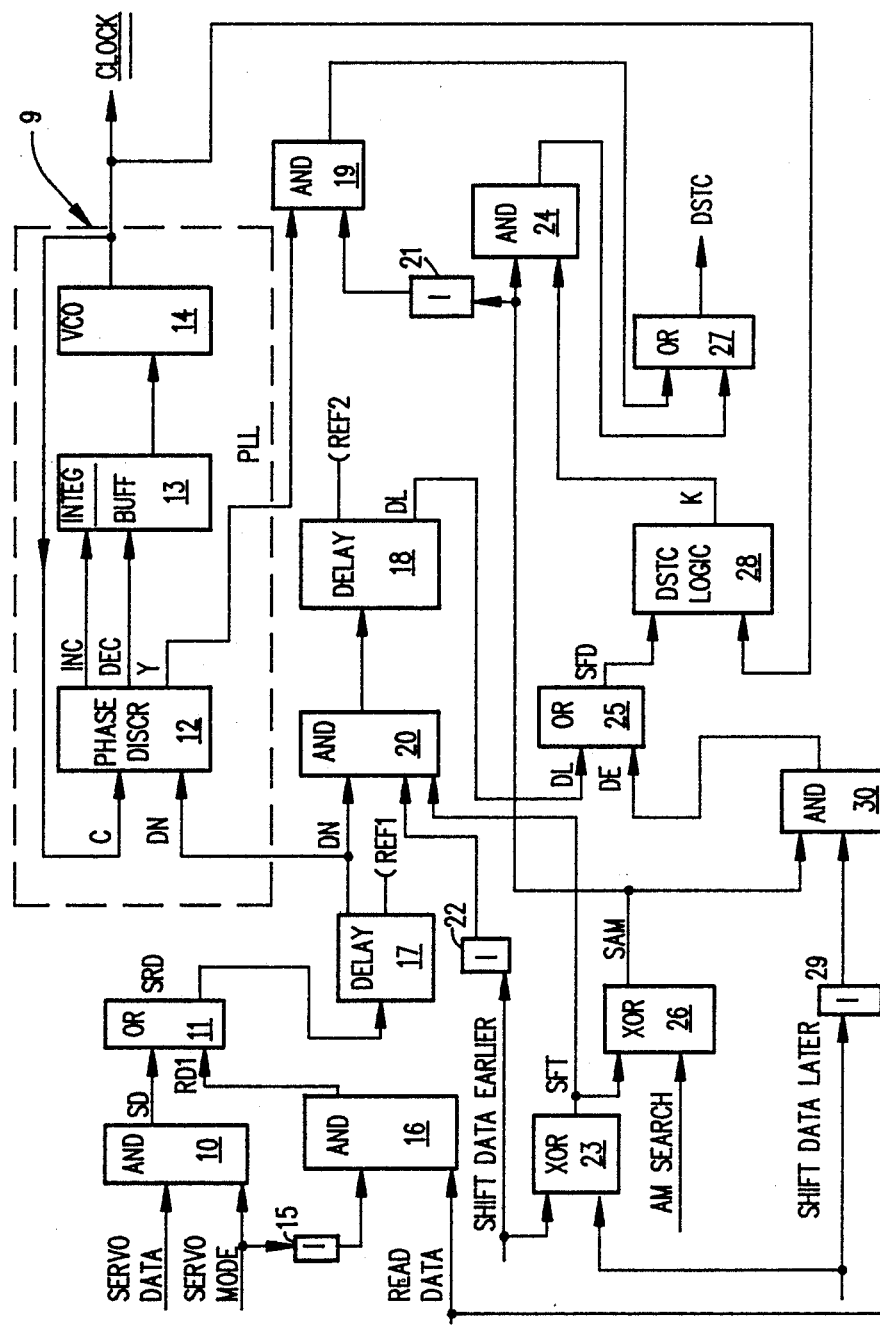
FIG. 1 is a schematic diagram of a simplified version of a data recovery apparatus embodying the invention.

A simplified version of the phase discrimination and data separation method and apparatus embodying the invention comprises two delay blocks and is shown in FIG. 1. As illustrated, the apparatus comprises a phase-locked loop (PLL) 9 including a phase discriminator 12, an integrator/buffer 13 and a voltage controlled oscillator (VCO) 14. The integrator/buffer 13 comprises a conventional charge pump and a low pass filter (not shown) which may be of the type disclosed in U.S. Pat. No. 4,034,309, incorporated herein by reference. The charge pump is simply a gated pair comprising a constant current source and a sink. The charge pump is fed by the phase discriminator 12, which produces a pair of phase-correction signals, INC and DEC, generated in the manner hereinafter described. VCO 14 provides a reference clock C, the frequency of which is determined by the magnitude of a voltage produced by the charge pump through the low pass filter.

When the data normal input pulses DN to PLL 9 lead clock signal C, phase discriminator 12 will produce a digital signal INC with a pulse width proportional to the phase difference (in time) and cause the charge pump to direct current to the filter to raise the magnitude of the voltage provided to VCO 14. The frequency of VCO 14 will increase in such a way as to catch up with the phase of the data normal pulses. On the other hand, when data normal pulses DN lag clock signal C, phase discriminator 12 will produce a digital signal DEC proportional to the phase difference. This causes the charge pump to reduce the charge on the filter and hence decrease the frequency of VCO 14. The net effect will be to retard the phase of clock signal C toward the phase of the read data normal pulses DN.

In the simplified method and apparatus illustrated in FIG. 1, positive logic is assumed; and the term "up" connotes a digital up level signal that enables or activates a device. Servo and read data pulses are applied selectively via two AND gates (AND) 10 and 16 and an OR gate (OR) 11 to provide servo/read data pulses SRD to a first delay block 17 Block 17 provides the data normal pulses DN to a second delay block 18 which when activated produces read data late pulses DL.

Various modes of operation are initiated upon command from control logic (not shown) in response to the following digital control signals: SHIFT DATA EARLIER or SHIFT DATA LATER is selectively activated when the error correction circuitry is unable to correct an error and the control logic identifies a potentially uncorrectable (hard) error. SERVO MODE and AM SEARCH are selectively activated by the control logic during searching for and accessing, respectively, a new track on the disk.

During normal read mode of operation, digital control signals SERVO MODE, SHIFT DATA EARLIER, SHIFT DATA LATER and AM SEARCH are down. Under this condition, the output SFT of an exclusive OR gate (XOR) 23 and output SAM of an XOR 26 are both down. Inverter 15 provides an up output, enabling the Read Data input to be selected by AND 16 and applied via OR 11 and the first delay block 17 to generate data normal pulses DN. These pulses DN are then fed to phase discriminator 12 of PLL 9, causing the PLL to provide a clock signal C synchronized to pulses DN, as earlier described. With SAM down, the output from inverter 21 to AND 19 is up. As a result, the DN pulses are also applied through phase discriminator 12 to be clocked out via the then activated AND 19 and OR 27 as the data-standardized-to-clock signal DSTC.

Assume now that the up excursion of a data pulse is late (like A in FIG. 3) and occurs just inside the data window following the proper data window, but that other pulses (like B) are within their proper window. The data pulses (including A and B) are shifted earlier in time by a small increment to positions A', B' without moving pulse B' outside its window.

Figure 3:
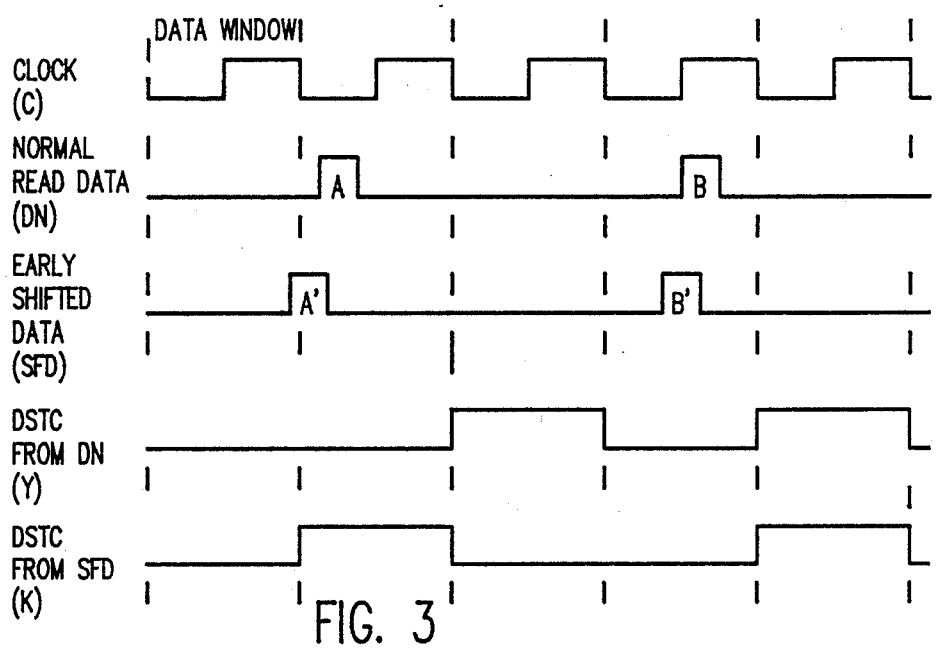
FIG. 3 and 4 are diagrams illustrating the timing relationships during shift data earlier and shift data late modes of operation, respectively, of the embodiment of FIG. 2.

During this shift data earlier mode of operation, the digital control signals SERVO MODE, SHIFT DATA LATER, and AM SEARCH are down, but SHIFT DATA EARLIER is brought up. Under these conditions, signal SFT of XOR 23 and signal SAM of XOR 26 will both be up. The Read Data input is selected, as before by AND 16 and OR 11 and pulses SRD are applied via delay block 17 to generate data normal pulses DN as before; and the clock signal C is again derived from the DN pulses. Concurrently, the Read Data input is also selected via another path by the now enabled AND 30 and an OR 25 to produce data early pulses DE and hence pulses SFD. Note that data late pulses DL are not generated because AND 20 is not activated. Pulses SRD and SFD are in phase because they are both generated from the Read Data input via the same number of gate delays; i.e. one AND and one OR. Furthermore since pulses DN are delayed from pulses SRD by delay block 17, pulses SFD will lead pulses DN. Pulses SFD are fed to a data-standardized-to-clock (DSTC) logic block 28 which phase compares the shifted data pulses SFD with the clock signal C for generating a DSTC signal for transmission to error correction circuitry (not shown). Under the assumed condition, with signal SAM up, the pulses SFD corresponding to the data early pulses DE will be clocked out through the activated AND 24 and OR 27 as the DSTC output signal. The DSTC output signal will by suitable means (not shown) appear a full data window earlier in time when read data pulses are marginally late (like A in FIG. 3 from their respective proper data windows. In FIG. 3, compare Y (before shift) with K (after shift). The amount of time delay and hence extent of shift can be controlled by preadjusting the reference voltage REF1.

Assuming now that the up excursion of a data pulse is early (like A in FIG. 4), the data pulse stream can be shifted later a small increment in time (e.g., from A to A'). During this shift data later mode of operation, the digital control signals SERVO MODE, SHIFT DATA EARLIER and AM SEARCH are down, but SHIFT DATA LATER is brought up. Signal SFT of XOR 23 and signal SAM of XOR 26 are again both up. The Read Data input is again selected by AND 16 and OR 11. Pulses SRD and DN will be generated, and clock signal C is again derived from the DN pulses. Since SHIFT DATA EARLIER is down, inverter 22 will enable AND 20. Hence the data late pulses DL will correspond to the Read Data input pulses. Pulses DL are generated by delay block 18, and hence are later in time than the DN pulses. The amount of delay can be controlled by preadjusting reference voltage REF2.

Figure 4:
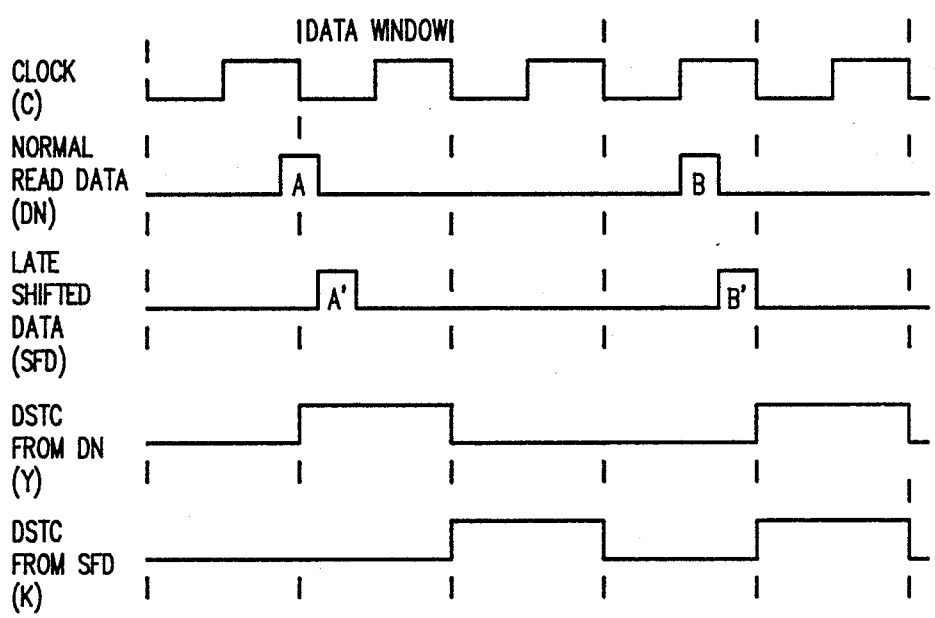

The DL pulses are selected by OR 25 because AND 30 is not activated due to inverter 29; and the DL pulses are thus standardized via DSTC logic block 28, and clocked out via the activated AND 24 and OR 27 as the DSTC signal output. Now the DSTC signal will appear a full data window later in time when read data pulses are marginally early (like A in FIG. 4) from their respective proper data windows. In FIG. 4, compare Y (before shift) with K (after shift).

When operating in a servo mode during track following, the digital control signals SHIFT DATA EARLIER, SHIFT DATA LATER and AM SEARCH are down, but SERVO MODE is brought up. Signal SFT of XOR 23 and signal SAM of XOR 26 are both down. The Servo Data input pulses are gated by AND 10 and OR 11 to generate pulses SRD. Pulses SRD, in turn, through delay block 17 generate pulses DN. Clock signal C is again derived from the pulses DN which, in this mode, have been derived from the Servo Data input pulses; however, in this mode, though DSTC signal is generated, it is ignored by the control logic unless an address mark (AM) search is called for.

During an address mark search operation, the digital control signals SHIFT DATA EARLIER and SHIFT DATA LATER are down but the SERVO MODE and now AM SEARCH are up. Signal SFT from XOR 23 is therefore down, but signal SAM from XOR 26 is up. With SERVO MODE up, the output of inverter 15 will disable AND 16. Hence, the Read Data pulses will be selected via AND 30 because signal SAM and the output of inverter 29 are up. The resultant pulses DE are applied via OR 25 to produce pulses SFD. Again, pulses DL are not generated because AND 20 is not activated with SFT down. It will thus be seen that pulses SFD are fed to DSTC logic block 28, and then clocked out via AND 24 and OR 27 as the standardized address mark output signal. This signal goes to the device electronics control logic (not shown) to effect an address mark recognition in conventional manner. Following such recognition, the VCO 14 is synchronized to data, also in conventional manner.

It will now be apparent that clock signal C is always synchronized to the DN pulses and hence defined by it. Hence, referenced to the clock signal C, pulses SFD will correspond to data early pulses DE, when DE is selected by AND 30 and OR 25. However, pulses, SFD will correspond to data late pulses DL when DL is selected by AND 20 and OR 25.

Figure 2:
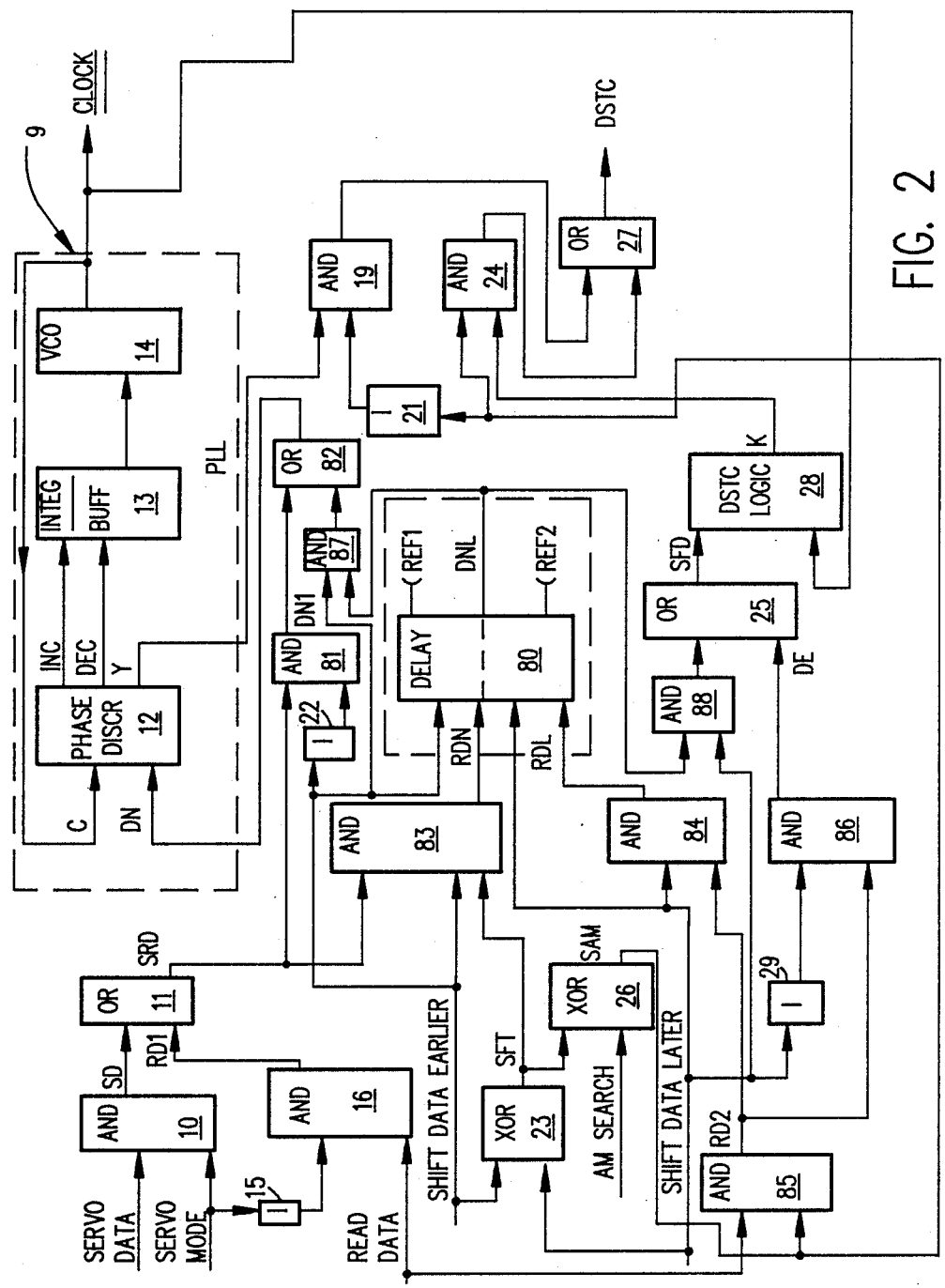
FIG. 2 is a schematic diagram of a preferred embodiment of the invention.

With this as background, the preferred embodiment will now be described. In the preferred embodiment, as illustrated in FIG. 2, like reference numerals and letters will be used to designate structure or signals that correspond to those described in connection with FIG. 1. The preferred embodiment differs from that in FIG. 1, in that in the preferred configuration, delay blocks 17 and 18 are eliminated and replaced at a different location by a single delay block 80 with two independently preadjustable delay reference voltages REF1 AND REF2 for early and late shifts. This provides a cost advantage and saving of a chip pad and module pin because one of the delay elements can be eliminated. As a result of this modification, a number of gates are also affected.

Referring now to FIG. 2, when digital control signal SHIFT DATA EARLIER is up and AND 83 is activated, REF1 is selected. REF2 is selected when digital control signal SHIFT DATA LATER is up and AND 84 is activated. The different modes of operation for the preferred embodiment will now be described.

During normal read mode of operation, the Read Data pulses are selected by AND 16 and OR 11 in exactly the same way as described in connection with FIG. 1, and then gated by AND 81 and OR 82 to produce data normal pulses DN. Pulses DN are then fed to phase discriminator 12 of PLL thereby causing the PLL to provide a clock signal C synchronized to the DN pulses. With signal SAM down, inverter 21 enables AND 19. The DN pulses are thus applied through phase discriminator 12 to be clocked out via the activated AND 19 and OR 27 as the data-standardized-to-clock signal DSTC. Note that pulses DN do not go through the delay block, thus differing from the embodiment of FIG. 1.

During shift data earlier mode of operation, the Read Data pulses are again selected by AND 16 and OR 11. With SHIFT DATA EARLIER up and SHIFT DATA LATER down, signal SFT will be up. Pulses SRD will thus be gated by the now activated AND 83 and further delayed by delay block 80, where the delay reference voltage REF1 is selected. Block 80 generates pulses DNL which are then selected by AND 87 and OR 82 to provide data normal pulses DN. Pulses DN are fed to the phase discriminator 12 of PLL 9. Therefore, clock signal C is derived from pulses DN. Concurrently, the Read Data pulses are also selected via another path by AND 85 and AND 86 to produce data early pulses DE. Pulses DE are then gated via AND 88 and OR 25 to produce pulses SFD to DSTC logic block 28 where they are clocked out through the activated AND 24 and OR 27 as the DSTC output signal to appear a full data window earlier in time when late data pulses are marginally late from their respective proper data windows (like A in FIG. 3), without affecting data pulses (such as B in FIG. 3) which are still within their respective data windows after the operation. In FIG. 3, compare Y and K.

Applicants have found that conventional cascode emitter coupled logic (CECL) has advantages over conventional single-ended logic. The CECL differential logic circuitry reduces the effects of noise and variations due to differences between rise and fall times and provides a better noise margin. It will be apparent that AND 10, AND 16 and OR 11 can be constructed with one CECL gate. Similarly, AND 87 and OR 82 can be constructed with one CECL gate, as can AND 88 and OR 25.

Pulses DN are obtained from the Read Data pulses when they ripple through a composite gate consisting of AND 10 or AND 16 and OR 11, together with gate AND 83, delay block 80 and finally CECL gate, AND 87 and OR gate 82, a total of three gates (including the CECL gate) and one delay block. On the other hand, pulses SFD are obtained from the same Read Data pulses when they ripple through AND 85, AND 86 and CECL gate AND 88 and OR 25, a total of three gates but without a delay block. Therefore, pulses DN, or equivalently the clock signal C, lag the pulses SFD by the delay provided by block 80.

During shift data later mode operation, the clock signal C is generated in exactly the same way as in the normal read mode of operation; i.e., it is derived from data normal pulses DN which are obtained from the selected Read Data pulses with a three gate delay (CECL gate 16 and OR 11, AND 81, and CECL gate AND 87 and OR 82) but without a delay from delay block 80. Pulses SFD are obtained from the same Read Data pulses but pass through AND 85, AND 84, delay block 80 and CECL gate, AND 88 and OR 25, a total of three gates plus the delay from delay block 80. Therefore, pulses SFD lag pulses DN or clock signal C by the delay provided by delay block 80. Pulses SFD once again are fed to DSTC logic block 28 and clocked out through the activated AND 24 and OR 27 as the DSTC output signal to appear a full data window later in time when read data pulses (like A in FIG. 4) are marginally late from their respective proper data windows. Again, in FIG. 4, compare Y and K.

During normal servo mode operation, the Servo Data pulses are selected instead of the Read Data pulses, and clock signal C is derived in exactly the same way as in the normal read data mode of operation. When address mark search is called for, the digital control signal AM SEARCH will be up and applied through XOR 26 to AND 85. The Read Data pulses will then be applied via AND 85, AND 86 and OR 25 to produce pulses SFD which are fed to DSTC logic block 28, and then clocked out via AND 24 and OR 27 as the standardized AM output signal.

By thus standardizing the data pulses to the VCO clock during address mark search, according to the invention, only one data bit is presented to the control logic for each data pulse received. The data bits are standardized to one clock period in duration and are in time phase with the clock while the VCO 14 is synchronized to servo data. By contrast, address mark detection heretofore has generally been conducted by simply strobing (or sampling) the serial data pulse stream with the VCO clock while the VCO 14 was synchronized to servo data. The sampled results were highly influenced by the pulse width of each data pulse and its time arrival with respect to the clock. If the data pulse were too narrow (less than one-half of a clock period), the data pulse might be undetected; whereas, if the data pulse were one clock period or longer, it could be and probably was detected as two data bits.

It will thus be seen that only data pulses (e.g., A in FIGS. 3 and 4) that are close to the boundary of the data window are affected by DSTC logic block 28; that the extent of time shift in each direction is preadjustable and may differ according to the voltages selected for REF1 and REF2; and that in response to a potentially uncorrectable error, the control logic is conditioned by suitable means (not shown) to initially provide a selectable one of the digital control signals SHIFT DATA EARLIER or SHIFT DATA LATER; and that if the error is not corrected by a shift of data pulses in the initially selected direction, the control logic is conditioned by said means to shift the data pulses in the opposite direction to once again try error correction.

Finally, according to another feature of the invention, the method and apparatus herein disclosed are capable of processing (1,7) RLL codes and other codes denser than (2,7) without dropping a bit. When an input bit arrives before phase error determination is completed for the previous bit (as may result from use of an (1,7) or denser RLL code), the newly arrived bit is not used for generating phase error voltage for VCO 14. All incoming bits, even when they are spaced closer than the bits a (1,7) code generates, will be standardized correctly to clock by the DSTC logic 28 during operation for shift data earlier, shift data later and address mark search.

DESCRIPTION AND OPERATION OF PHASE DISCRIMINATOR

Figure 5:
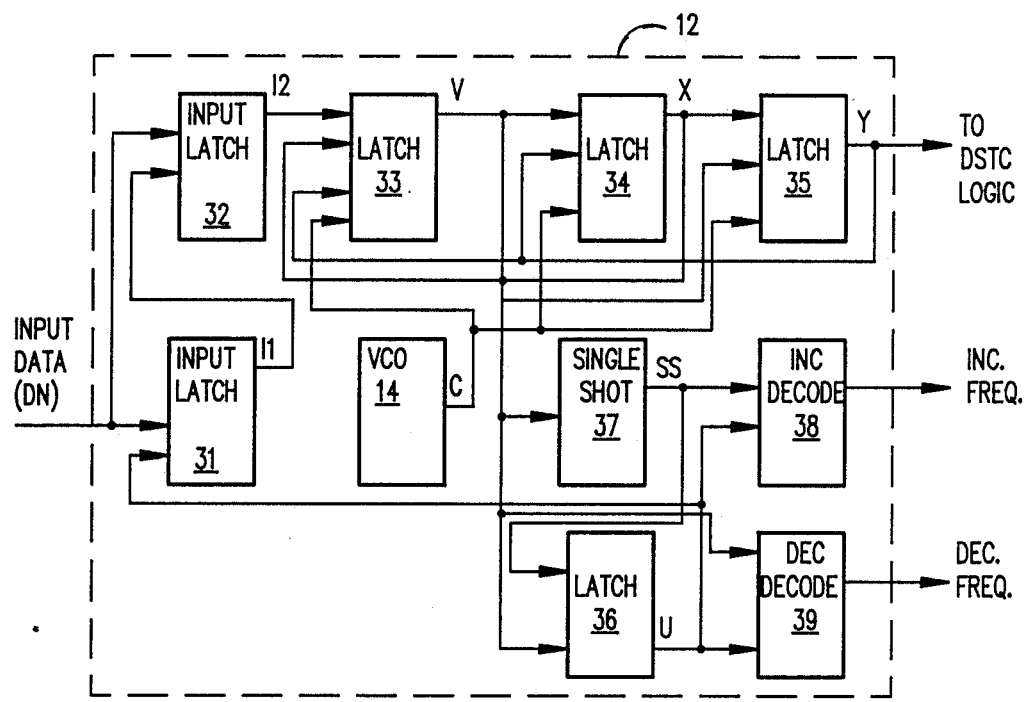
FIG. 5 is a schematic diagram showing the phase discriminator of FIG. 2 in greater detail.

As illustrated in FIG. 5, phase discriminator 12 comprises latches 31-36, a single shot circuit 37 and decoders 38, 39. Decoders 38, 39 effect an increase and decrease, respectively, in the frequency of VCO 14.

Figure 6:
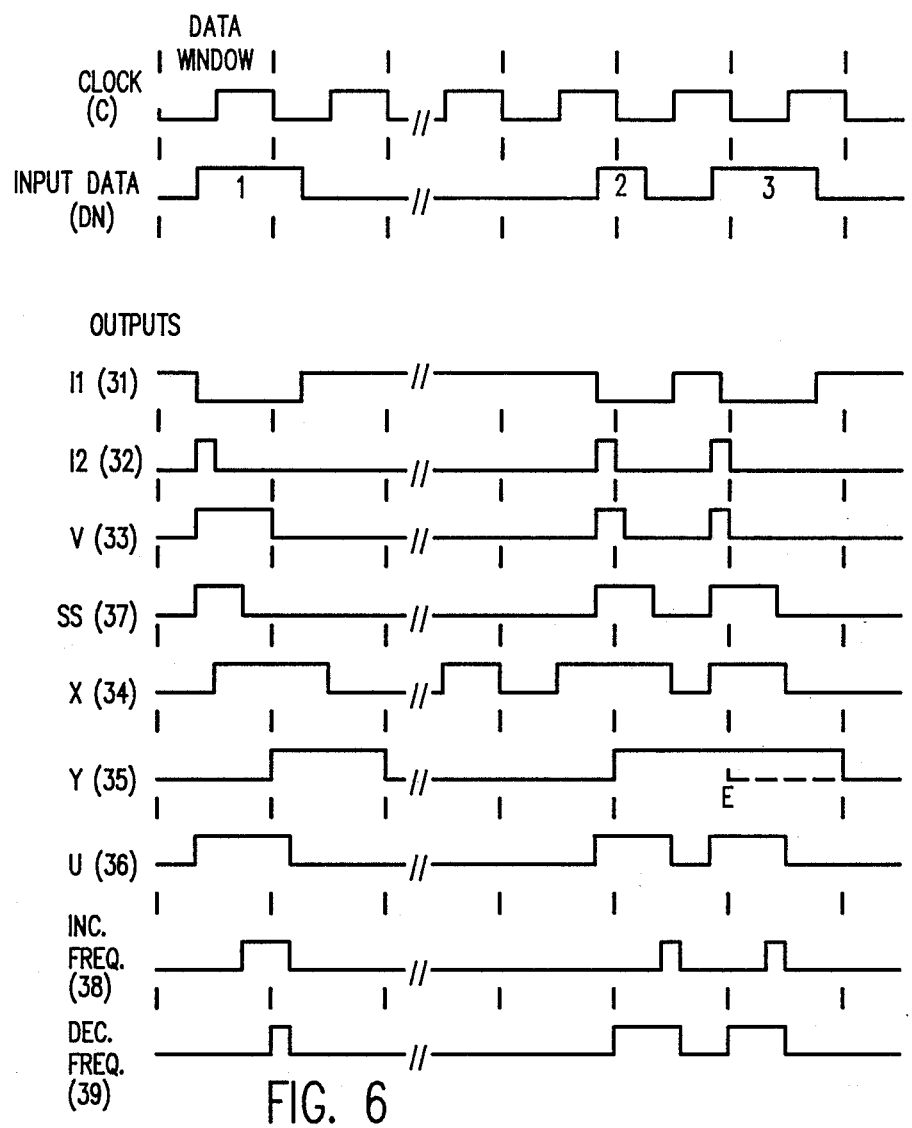
FIG. 6 is a timing diagram for the phase discriminator.

A timing diagram for phase discriminator 12 is shown in FIG. 6. The conditions for setting and resetting the latches 31-36 are given in Table I below in which the reset state of a latch is indicated by a bar over the variable and the set state is indicated by the absence of the bar.

TABLE I

| SET CONDITIONS | LATCH | RESET CONDITIONS |
|---|---|---|
| $I1 = \overline{DN} \cdot \overline{U}$ | 31 | $\overline{I1} = U$ |
| $I2 = I1 \cdot DN$ | 32 | $\overline{I2} = \overline{I1}$ |
| $V = I2 \cdot (\overline{X} \cdot Y + \overline{Y})$ | 33 | $\overline{V} = \overline{I2} \cdot X \cdot Y \cdot \overline{C}$ |
| $X = (V \cdot Y) + (\overline{Y} \cdot C)$ | 34 | $\overline{X} = (\overline{V} \cdot Y \cdot C) + (\overline{V} \cdot \overline{Y} \cdot \overline{C})$ |
| $Y = V \cdot X \cdot \overline{C}$ | 35 | $\overline{Y} = \overline{V} \cdot \overline{X} \cdot \overline{C}$ |
| $U = SS$ | 36 | $\overline{U} = \overline{V} \cdot \overline{SS}$ (plus delay) |

The phase correction signals shown in FIG. 6 that are generated by the phase discriminator 12 illustrated in FIG. 5 are given by equations (1) and (2).

$$INC = U \cdot \overline{SS} \qquad (1)$$

$$DEC = U \cdot \overline{V} \qquad (2)$$

In operation, assume initially all latches 32-36 except 31 are reset. Assume now that a positive transition of a read data normal pulse DN is detected before an up going transition of the clock signal C (see read input data pulse 1 in FIG. 6). Under this assumed condition, latches 32 and 33 will set, which in turn fires single shot 37. The output signal SS of single shot 37 has a pulse width of about half a VCO clock period. Signal SS is subsequently fed to the input of the latch 36 to set the latch. After latch 36 is set, latch 31 will be reset and reset latch 32. It can be seen that latches 31 and 32 are not concerned with the pulse width of the data normal pulses DN. At the first positive clock transition, latch 34 will be set. When the single shot 37 times out, the INC signal defined by equation (1) satisfies INC decode gate 38. Gate 38 will assume a positive state causing the charge pump in 13 (FIG. 2) to raise the voltage provided to VCO 14 and increase the frequency of the VCO. The equation will remain true until latch 36 is reset immediately after clock signal C goes down and the following events are completed: the setting of latch 35 and resetting of latch 33 and then latch 36.

It should be noted that when the condition ($\overline{V} \cdot \overline{SS}$ + delay) for resetting latch 36 is met, resetting of said latch will not begin until after an imposed delay interval has passed. The DEC signal will be up and last during this delay interval. This will force signals INC and DEC to overlap to prevent the occurrence of a deadband region in the response of the PLL system that would result from a finite time required to switch the charge pump current circuits. As each data normal pulse DN and output U of latch 36 go down, latch 31 will be set. When clock signal C goes up again, latch 34 will be reset. And finally, when clock signal C goes down again, latch 35 will reset. This completes a cycle for a phase correction to input data pulse 1 in FIG. 6.

Assume now that the first positive transition of a read data normal pulse DN arrives following the up going transition of the clock signal C (see read input data pulse 2 in FIG. 6). Under this assumed condition, latch 31 and latch 34 will have already been set according to Table I; and latch 32 and then latch 33 will set as before. This will cause the output of latch 33 to go positive and fire the single shot 37. The output U of latch 36 will then go positive and reset latch 31 which will reset latch 32. When the down going transition of clock signal C arrives, latch 35 will set and cause latch 33 to reset. At this time the DEC signal defined by equation (2) will satisfy DEC decode gate 39. Gate 39 will go positive causing the charge pump in 13 to provide a voltage to VCO 14 for decreasing the frequency of the VCO. When a data normal pulse DN goes down, it will set input latch 31 but only after latch 36 is reset. Equation (2) will now remain true until after single shot 37 times out and the built-in delay in resetting latch 36 has passed. Note that the INC signal rises immediately after single shot 37 times out and it overlaps the DEC signal to neutralize a portion of INC signal and thereby prevent a deadband region. The positive transition of clock signal C will reset latch 34. If no input data pulse arrives at this time, latch 35 as usual will be reset by the following negative transition E of the clock signal C as shown in FIG. 6. The cycle will then be completed for the phase correction of input data pulse 2.

Assume now that a positive transition of a data normal pulse DN arrives after latch 34 is reset but before latch 35 gets reset (see bit 3 in FIG. 6). Under this condition, latch 32 is set and then latch 33 is set, causing latch 34 to set and fire the single shot 37. At this time, even if the clock signal C goes down, latch 35 will still be in a digital high state because latch 34 is also in a digital high state. Once the single shot 37 fires, latch 36 is set which causes latches 31 and 32 to reset. Thereafter the same steps are followed as previously described in connection with input data pulse 2. It is important to note that the output of latch 35 in this case has a pulse width of two clock periods which will be decoded as two adjacent bits by the system.

DESCRIPTION AND OPERATION OF DSTC LOGIC BLOCK

Figure 7:
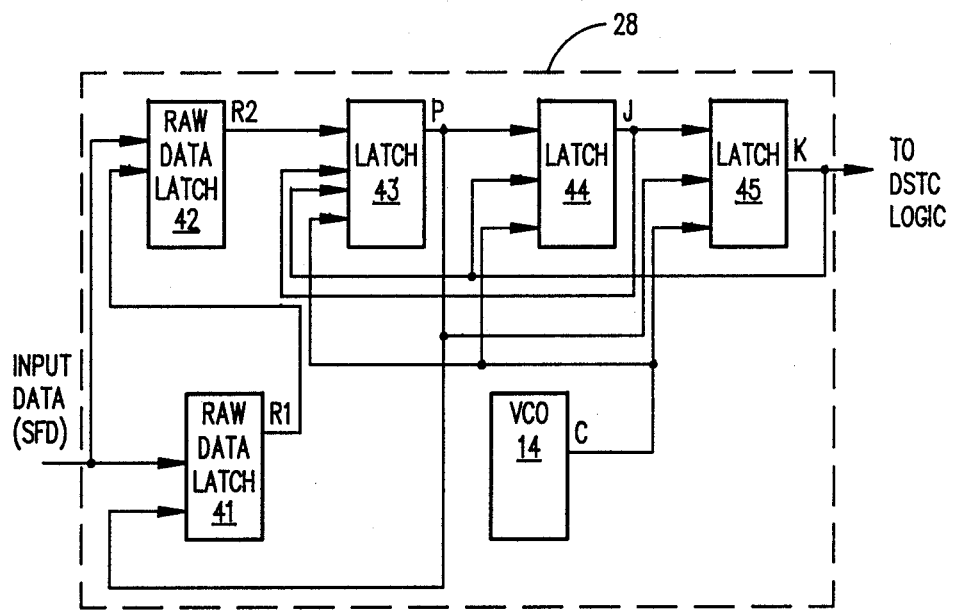
FIG. 7 is a schematic diagram showing the data-standardized-to-clock (DSTC) block of FIG. 2 in greater detail.

DSTC logic block 28 as illustrated in FIG. 7 comprises latches 41-45. Latches 41-45 are interconnected in substantially the same manner as latches 31-35, respectively, FIG. 5. The conditions for setting and resetting the latches 41-45 are given in Table II. As before, the reset state of a latch is indicated by a bar over the variable while the set state is indicated by absence of the bar.

TABLE II

| SET CONDITIONS | LATCH | RESET CONDITIONS |
|---|---|---|
| $R1 = \overline{SFD} \cdot \overline{P}$ | 41 | $\overline{R1} = P$ |
| $R2 = R1 \cdot SFD$ | 42 | $\overline{R2} = \overline{R1}$ |
| $P = R2 \cdot (\overline{J} \cdot K + \overline{K})$ | 43 | $\overline{P} = \overline{R2} \cdot J \cdot K \cdot \overline{C}$ |

TABLE II-continued

| SET CONDITIONS | LATCH | RESET CONDITIONS |
|---|---|---|
| $J = (P \cdot K) + (\overline{K} \cdot C)$ | 44 | $\overline{J} = (\overline{P} \cdot K \cdot \underline{C}) + (\overline{P} \cdot \overline{K} \cdot \overline{C})$ |
| $K = P \cdot J \cdot C$ | 45 | $\overline{K} = \overline{P} \cdot J \cdot C$ |

Upon comparing Tables I and II, it will be noted that the logic implementations for phase discriminator 12 and DSTC logic block 28 are almost identical. Because latches 41-45 are interconnected in substantially the same manner as latches 31-35, respectively, SFD, R1, R2, P, J and K in FIG. 7 correspond to DN, I1, I2, V, X and Y in FIG. 5. Note that in FIG. 7 there is no latch comparable to latch 36 (hence no signal U) and no single shot comparable to single shot 37; hence input latch 41 must be reset in a different way than input latch 31. As illustrated, raw data latch 41 is reset by output P of latch 43 to achieve the same logic flow. This modification is necessary because in phase discriminator 12, an input data pulse may arrive before the phase error determination for the previous bit is completed. In phase discriminator 12 this earlier arrival of an input data pulse is ignored in order to avoid interference and prevent erroneous phase measurement for that pulse.

Figure 8:
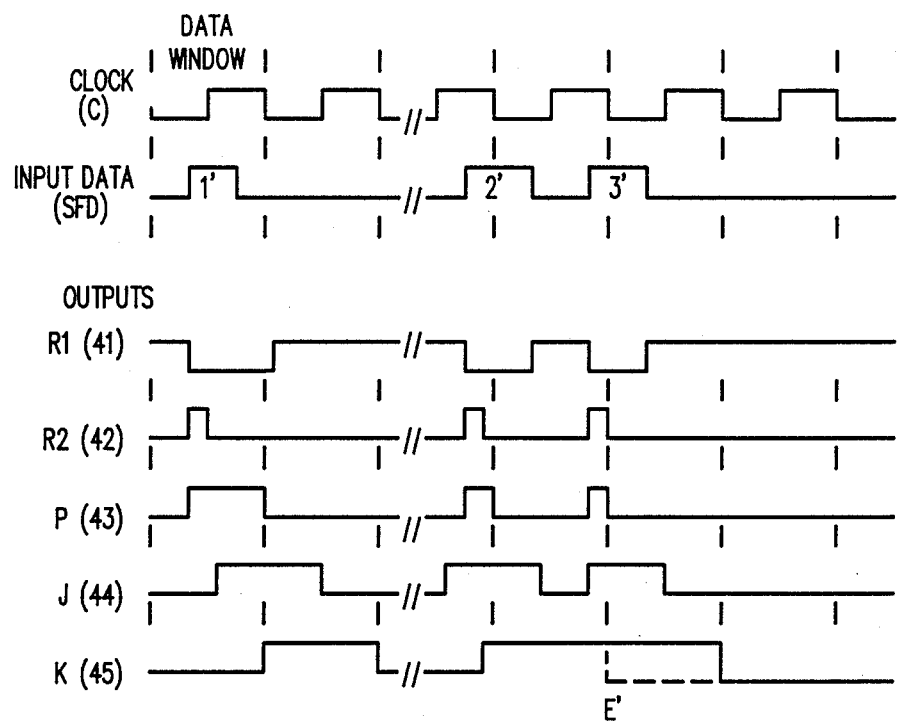
FIG. 8 is a timing diagram for the DSTC block.

FIG. 8 is a diagram depicting the timing of the various signals in DSTC logic block 28, and which should be understood without detailed discussion in view of the prior description in connection with FIGS. 5 and 6 of the timing signals in phase discriminator 12.

It will be understood that various changes may be made in the method and apparatus herein described. The embodiments described are therefore to be considered merely illustrative, and the invention is not to be limited except as specified in the claims.

We claim:

1. A method of maintaining read data pulses standardized to a data-synchronized clock, comprising the steps of:
    delaying the read data pulses a preselected time interval to provide data normal pulses,
    applying the data normal pulses to a phase-locked loop (PLL) to provide and define the clock,
    responsive to a control signal indicative of a potentially uncorrectable error, selectively, according to a preselected choice, generating data early pulses corresponding to the read data or generating data late pulses corresponding to further delayed read data pulses, and
    selectively clocking out according to said choice bits corresponding to the data early or data late pulses to error correction circuitry in an attempt to render the error correctable.

2. The method of claim 1, wherein the read data is in the form of an RLL code at least as dense as (1,7).

3. The method of claim 1, wherein the respective amounts the read data is shifted in time are dependent upon said predetermined time interval and said further delay.

4. The method of claim 1, including the step, during operation in a normal read mode, of
    applying the data normal pulses by way of a phase discriminator in a PLL as data standardized to clock.

5. The method of claim 1, wherein during the clocking step
    only late read data pulses adjacent a data window boundary will be shifted a full data window earlier in time if the data early pulses are clocked out, and only early read data pulses adjacent a data window boundary will be shifted a full data window later in time if the data late pulses are clocked out.

6. Apparatus for standardizing read data to a data-synchronized clock, comprising means for conveying a control signal indicative of a potentially uncorrectable error, means responsive to said control signal for shifting the read data earlier in time relative to the clock, and means responsive to the earlier shifted read data and the clock for generating a data-standardized-to-clock (DSTC) signal for error correction, a phase-locked loop (PLL) to which read data pulses are applied for synchronizing the clock, means for delaying, for preselected time interval, all such successive read data pulses to said PLL, and means including means conditioned by said control signal for providing read data undelayed by said delaying means in order to enable shifting of read data earlier in time relative to the clock.

7. The apparatus of claim 6, including means for conveying another control signal indicative of a potentially uncorrectable error, means responsive to said other control signal for shifting the read data later in time relative to the clock, and means responsive to the later shifted read data for generating a DSTC signal for error correction.

8. The apparatus of claim 7, wherein the interval by which the read data is shifted earlier in time is different than that by which the read data is shifted later in time.

9. The apparatus of claim 6, wherein said DSTC signal causes only marginally late read data pulses adjacent a data window boundary to appear a full data window earlier in time.

10. The apparatus of claim 6, wherein the read data is in the form of an RLL code at least as dense as (1,7).

11. Apparatus for standardizing read data pulses to a servo data-synchronized clock during an address mark search operation, comprising a phase-locked loop (PLL), means for applying the servo data to said PLL for establishing the clock, and means including logic circuitry responsive to the read data and clock for causing the read data pulses to be clocked out as standardized data bits for address mark detection.

* * * * *